United States Patent [19]

Takahashi et al.

[11] Patent Number: 5,080,552

[45] Date of Patent: Jan. 14, 1992

[54] APPARATUS FOR SUPPLYING RESIN TABLETS FOR USE IN ENCAPSULATING SEMICONDUCTOR DEVICE

[75] Inventors: Fumio Takahashi; Koshi Murakami, both of Yokohama, Japan

[73] Assignee: Kabushiki Kaisha Toshiba, Kawasaki, Japan

[21] Appl. No.: 415,558

[22] Filed: Sep. 26, 1989

[30] Foreign Application Priority Data

Sep. 27, 1988 [JP] Japan .................. 63-242032

[51] Int. Cl.$^5$ .............................................. H05K 3/30
[52] U.S. Cl. .................. 414/798.1; 414/403; 414/416; 414/224; 221/298
[58] Field of Search .............. 414/798.1, 798, 797.8, 414/797.4, 746.4, 795.7, 416, 224, 403, 404; 221/298; 53/313, 315

[56] References Cited

U.S. PATENT DOCUMENTS

| | | | |
|---|---|---|---|
| 3,300,090 | 1/1967 | Carden | 221/298 |
| 3,602,403 | 8/1971 | Klem | 221/298 X |
| 4,578,010 | 3/1986 | Harigane et al. | 414/798 |
| 4,623,293 | 11/1986 | Brown et al. | 414/798 |
| 4,739,872 | 4/1988 | Roberts et al. | 414/224 X |
| 4,809,881 | 3/1989 | Becker | 414/798.1 X |

FOREIGN PATENT DOCUMENTS

| | | | |
|---|---|---|---|
| 1278771 | 1/1968 | Fed. Rep. of Germany | 221/298 |
| 0088703 | 4/1987 | Japan | 414/797.4 |
| 0051216 | 3/1988 | Japan | 414/798 |

Primary Examiner—Robert J. Spar
Assistant Examiner—James Eller
Attorney, Agent, or Firm—Foley & Lardner

[57] ABSTRACT

A resin tablet supplying apparatus comprising a plurality of tablet accommodating parts, a tablet discharge part and transporting part. The plurality of table accommodating parts are fixedly mounted at predetermined positions for accommodating a plurality of resin tablets by stacking one upon another with its central longitudinal axis being laid lateral. The tablet accommodating part is formed with a table discharge opening at its bottom end, and the resin tablet is formed generally of a pillar shape and used in encapsulating semiconductor device. The tablet discharge part discharges the tablets in each of the tablet accommodating part, by dropping down the tablets one at a time from the opening. The transporting part receives the tablet discharged one at a time by the tablet discharge part irrespective of whatever the axial length of the tablet may be, and transports the received tablet to a tablet conveying part for conveying the tablet to the next process. The tablet receiving and transportation working is sequentially repeated with respect to the tablets in the plurality of tablet stockers.

5 Claims, 5 Drawing Sheets

FIG. IA

APPARATUS FOR SUPPLYING RESIN TABLETS FOR USE IN ENCAPSULATING SEMICONDUCTOR DEVICE

FIELD OF THE INVENTION

The present invention relates to a resin tablet supplying apparatus for supplying resin tablets for use in encapsulating a semiconductor device during the semiconductor device production process.

BACKGROUND OF THE INVENTION

FIGS. 4 and 5 show a conventional apparatus for supplying resin tablets for use in sealing a semiconductor device. As best seen from FIG. 4, the supplying apparatus operates as in the following. An arm 1 moves upward to supply a tablet 2 one at a time to a tablet chuck 3. When all tablets in a tablet stocker 4a are discharged, a stocker table 5 is rotated about a shaft 16 to move another tablet stocker 4b to the position where the table stocker 4a was located as shown in FIG. 4. By repeating the above operations, the tablets in the stockers 4a and 4b are supplied to the chuck 3.

The arm 1 is moved upward/downward as an arm up/down drive motor 8 rotates. The rotation of the motor 8 is transmitted via a rotation transmission mechanism 9 to an arm up/down drive shaft 10 made of a screw.

The shaft 10 has a female screw member 11, both being rotatable relative to each other. When the shaft 10 rotates in the normal/reverse direction, the female screw member 11 moves upward/downward. The arm 1 is fixedly mounted on the female screw member 11 so that the arm 1 is moved upward/downward together with the female screw member 11.

The stocker table 5 is rotated by a stocker table drive motor 13. The rotation of the motor 13 is transmitted via a rotation transmission mechanism 14 to a stocker table drive mechanism 15. The drive mechanism 15 transforms the transmitted rotation into the rotation of a shaft 16. The stocker table 5 rotates together with the shaft 16.

With the above operations when a tablet 2 is supplied to the tablet chuck 3, the tablet chuck 3 holds and sends it to a preheat process or directly to a molding process.

The above-described apparatus has the following problems:

(a) If the size, i.e., axial length (thickness, width), of the tablet 2 is changed, it is necessary to adjust or exchange the chuck 3 and stocker table 5 so as to meet the changed size. During such adjustment or exchange work, a supply of tablets 2 is stopped to thereby lower the operation rate of the apparatus. It is necessary to lower the arm 1 positioned at an upper position to the lower limit position and to rotate the stocker table 5 when the tablet stocker 4a is exchanged for the tablet stocker 4b. Therefore the operation rate of the apparatus becomes lower.

(b) In order to continuously supply tablets 2, it is necessary to prepare space for installing one or a plural number of tablet stockers 4a, 4b. It is also necessary to provide a mechanism and space for rotating the stocker table 5 in a horizontal plane to change from the tablet stocker 4a to the stocker 4b. The apparatus therefore becomes large, complex and expensive.

(c) Since the tablet 2 is supplied to the chuck 3 at a fixed position, the usage efficiency of apparatus space is poor.

SUMMARY OF THE INVENTION

The present invention has been made while considering the above-described problems. It is an object of the present invention to provide a tablet supplying apparatus having a plurality of tablet stockers, which is compact and simple in structure, and capable of readily dealing with changes in the size, i.e., length (thickness) of the tablet.

Each tablet stocker is mounted at a predetermined position. A plurality of tablets are stacked one upon another within each stocker, with the axis of a tablet being disposed laterally. Each tablet made of resin is used for sealing a semiconductor device, and generally formed in a pillar shape. Tablets in the stocker are taken out from a tablet outlet formed at the bottom of the stocker, one at a time with the aid of a tablet discharge mechanism. The discharged tablet, whatever its length (width) may be, is placed on a tablet receiver and transported to the tablet conveying means to convey the tablet to the next process. The above operations are repeated for a tablet stocker. After all tablets within the stocker are taken out, the above operations are carried out sequentially for other tablet stockers.

According to the present invention, the following advantageous effects are obtained. Namely, a plurality of tablet stockers are mounted at fixed positions and the tablet receiver for receiving tablets from tablet stockers is arranged so as to be movable. The apparatus can therefore be made compact and simple in structure when compared with the apparatus having rotatable tablet stockers. In addition, the tablet receiver is arranged so as to be capable of receiving tablets whatever their length (width) may be. Therefore, even if the length (width) of tablets are changed, it is not necessary to stop the apparatus and adjust its components, thereby ensuring continuous operation of the apparatus. Moreover, it is not necessary to lower the arm such as arranged in the apparatus of the background art, so as to receive a tablet accommodated in a tablet stocker. Therefore, since there is no lost time, the efficiency is not lowered.

DESCRIPTION OF THE DRAWINGS

FIG. 1a is an enlarged fragmentary perspective view of an intermediate detection sensor;

DESCRIPTION OF THE PREFERRED EMBODIMENTS

Figure 1:
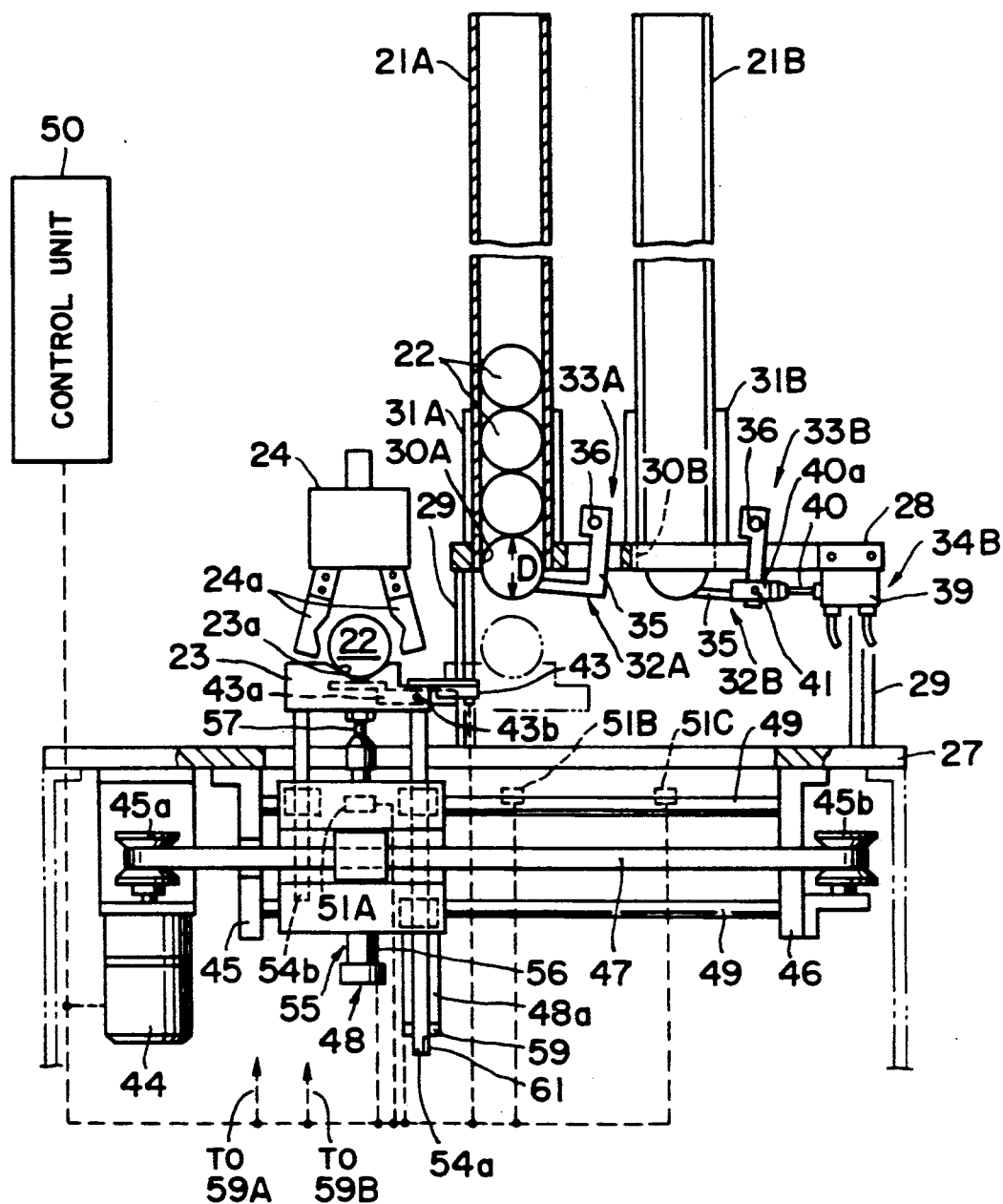
FIG. 1 is a front view showing an embodiment of the resin tablet supply apparatus according to the present invention.
Figure 2:
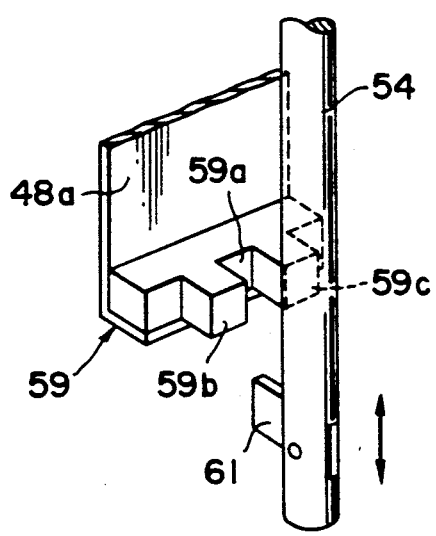
FIG. 2 is a side view of the embodiment shown in FIG. 1.
Figure 2:
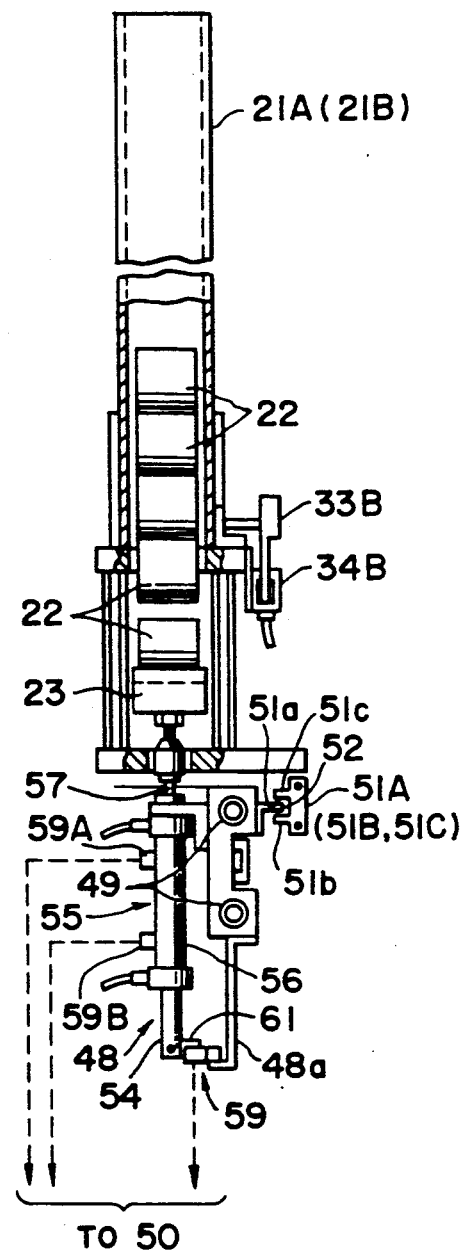

FIGS. 1 and 2 are front and side views of the embodiment of this invention. The operation of this embodiment is described in the following. Tablet stockers 21A and 21B are fixedly mounted at specific positions. Resin tablets 22 generally of a pillar shape housed within one of the stockers 21A and 21B are fed one at a time onto a tablet receiver 23 which is movable up/down freely. The tablet receiver 23 transports the received tablet 22 to a tablet chuck 24 one at a time and feeds it to the tablet chuck 24. The above operations are repeated for each stocker.

The embodiment will be described in more detail hereinunder. A stocker plate 28 is mounted on feet 29, 29, . . . , above a fixed base plate 27. The plate 28 is formed with tablet discharge holes 30A, 30B along a line extending from the right to left as viewed in FIG. 1. The bottom ends of the tablet stockers 21A, 21B of a rectangular cylinder shape are fitted into the holes 30A, 30B. The stockers 21A, 21B are supported by reinforcing members 31A, 31B integrally mounted on the base plate, so that the stockers do not fall down. The stockers 21A, 21B are made detachable relative to the base plate 27 and reinforcing members 31A, 31B. Mounted on the stocker plate 28 are tablet discharge mechanisms 32A, 32B for discharging tablets 22 one by one. The mechanisms 32A, 32B are provided with tablet stoppers 33A, 33B and stopper drive cylinder actuators. The drive cylinder actuator for mechanism 32B has the same structure as nonillustrated actuator for mechanism 32A. The stopper drive cylinder actuator 34A is however omitted in FIG. 1. The tablet discharge mechanisms 32A, 32B have the same structure, so only the tablet discharge mechanism 32B will be described. The tablet stopper 33B of the tablet discharge mechanism 32B has a stopper member 35 generally of an L-character shape, the one end of the member 35 being pivotally coupled to a pin 36.

A cylinder actuator main body 39 of the cylinder actuator 34B is fixed on the surface of the plate 28. An arm 40a at the tip of the rod 40 of the cylinder actuator 34B is coupled to the stopper member 35 with shaft 41 while allowing the pivotal movement of the latter. The stopper member 35 is thereby driven reciprocally about the pin 36 upon extension/contraction of the rod 40. Specifically, the stopper member 35 takes a position shown in FIG. 1 at which the tablet 22 is prevented from dropping down, and after rotating in the counterclockwise direction about the pin 36, takes a position (refer to FIG. 3C) at which the tablet 22 is allowed to drop down.

Under the tablet stockers 21A, 21B, there is provided the tablet receiver 23 which receives a tablet 22 from the tablet stocker 21A, 21B and transports it to the tablet chuck 24.

Figure 3A:
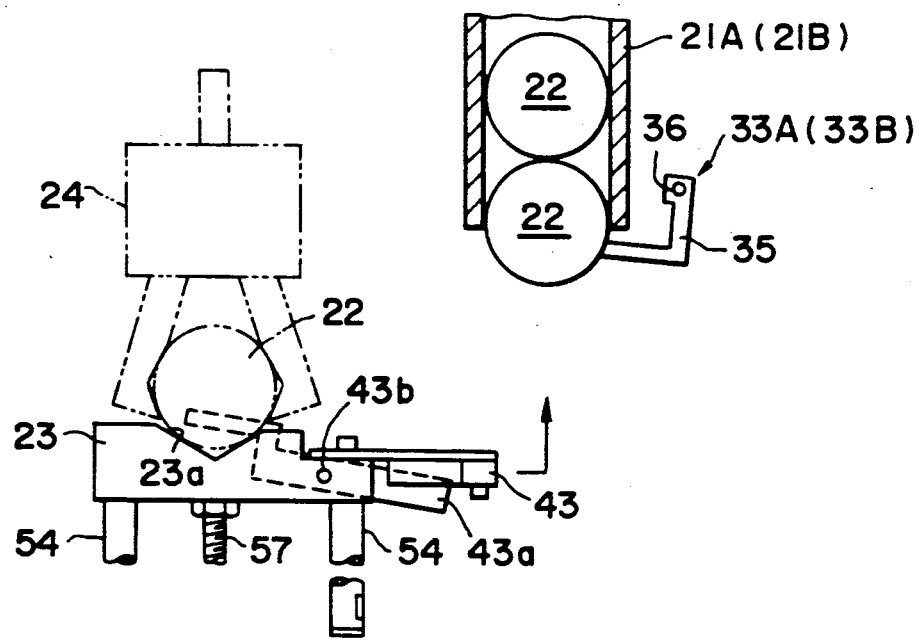
FIGS. 3A to 3E are partial front views for explaining the operation, of the embodiment.

The tablet receiver 23 has a groove 23a with a V-shaped cross section so as to stably receive the circumferential surface of a pillar tablet 22 laterally laid thereon. The tablet receiver is also provided with an optical tablet sensor 43 for detecting the presence/absence of a tablet 22 on the groove 23a. The sensor 43 includes a light emitting unit and light receiving unit facing each other. The optical path therebetween is closed or opened by a detection piece 43a to thereby turn on or off the sensor 43. The detection piece 43a is pivotally supported at its center portion by a pin 43b. As is best shown in FIG. 3A, when there is no tablet 22 on the tablet receiver 23, the right end portion, as viewed in FIG. 3A, of the detection piece 43a goes downward by its own weight as indicated by a broken line so that the optical path between the light emitting and receiving units is opened to turn off the sensor 43. On the other hand, when a tablet 22 is placed on the tablet receiver 43, the left end portion, as viewed in FIG. 3A, of the detection piece 43a is pushed downward by the weight of the tablet 22 so that the detection piece 43a rotates about the pin 43b in the counterclockwise direction to take a horizontal position. As a result, the optical path between the light emitting and receiving units is closed by the right end portion of the detection piece 43a so that the sensor 43 is turned on to thereby output a tablet detection signal.

The tablet receiver 23 constructed as above is movable up, down, right and left as viewed in FIG. 1. On the bottom surface of the base plate 27, there are mounted a horizontal drive motor 44 and a pair of support members 45 and 46. A pulley 45a is rotated with this motor 44. A belt 47 is extended between the pulley 45a and another pulley 45b supported freely rotatable on the support member 46. Upon reciprocal rotation of the pulley 45a, the belt 47 reciprocally moves in the horizontal direction. A tablet receiver mount 48 moves in the horizontal direction together with the belt 47, while being guided by a horizontal movement guide 49 riding over the support members 45 and 46. Horizontal position alignment sensors 51A to 51C are fixedly mounted on the base plate 27 in order to stop the mount 48 at the respective three positions. The first position is under the tablet chuck 24, the second position is under the tablet stocker 21A, and the third position is under the tablet stocker 21B.

The position alignment sensors 51A to 51C are constructed of optical sensors similar to the tablet detection sensor 44. Specifically, as shown in FIG. 2, each position alignment sensor has a groove 51a. When a position alignment piece 52 fixed at the back of the mount 48 enters into the groove 51a of the sensor 51A (51B, 51C) as the mount 48 moves in the horizontal direction, the optical path between a light emitting unit 51b and light receiving unit 51c is intercepted so that the sensor 51A (51B, 51C) is actuated to output a first (second, third) position detection signal. In accordance with these position detection signals, the rotation of the horizontal drive motor 44 is controlled by a control unit 50 so that the mount 48 (tablet receiver 23) stops at one of the first to third positions. For example, in order to move the mount 48 from the first position shown in FIG. 1 to the third position under the tablet stocker 21B, the control unit 50 outputs a signal to rotate the motor 44 and move the mount 48 to the right as viewed in FIG. 1. The sensor 51C will then be actuated to output the third position detection signal to the control unit 50 which in turn stops the motor 44. In this manner, the mount 48 stops at the third position under the stocker 21B.

The mount 48 also supports, in an up/down slidable manner, a rod 54 which fixedly mounts at its upper end the tablet receiver 23. The up/down movement of the tablet receiver 23 is carried out by an up/down drive cylinder actuator 55 provided at the mount 48. The cylinder actuator main body 56 of the actuator cylinder 55 is mounted on the mount 48, and the rod 57 is coupled to the tablet receiver 23. The tablet receiver 23 is therefore moved upward/downward as the rod 57 of the cylinder actuator 55 expands or contracts. The up/down movement is guided by rods 54a and 54b. In order to stop the tablet receiver 23 at two predetermined positions, i.e., an upper limit position (refer to FIG. 3B) and lower limit position (refer to FIG. 3E), there are provided, at the outside portion of the cylinder actuator as seen from FIG. 1A, an upper limit position sensor 59A and lower limit position sensor 59B constructed of such as a magnetic reed switch. The sensors 59A and 59B detect the upper and lower limit positions of the piston. An intermediate position detection sensor 59 (refer to FIG. 2) is mounted on a plate 48a extending downward from the tablet receiver 48. The intermediate position sensor 59 is used for detecting the timing when the tablet receiver 23, while going down from the upper limit position to the lower limit position, passes a predetermined position, i.e., a position (intermediate position) lower than the upper limit position by the amount of the diameter D of a tablet. The sensor 59 is constructed of an optical sensor similar to the sensors 51A to 51C. Specifically, as seen from FIG. 1A, there are mounted a light emitting unit 59b and light receiving unit 59c, with a groove 59a extending in the up/down direction being interposed therebetween. When the tablet receiver 23 reaches the intermediate position, a position alignment piece 61 fixedly mounted at the lower end of the rod 54a enters into the groove 59a. The optical path between the light emitting and receiving units 59b and 59c is therefore intercepted, and the sensor 59 outputs an intermediate position detection signal.

The signals from the upper and lower limit position sensors 59A and 59B are supplied to the control unit 50 which in turn controls the movement of the cylinder actuator 55. In this manner, the tablet receiver 23 is stopped at the upper limit position while moving upward, and at the lower limit position while moving downward. During the downward movement of the tablet receiver 23, in accordance with a signal from the intermediate position detection sensor 59, the cylinder actuator 39 is controlled in the manner to be described later, and the stopper member 35 moves from the open state to the close state (refer to FIG. 3D).

The tablet chuck 24 has two arms 24a, 24a which are opened and closed to squeeze the tablet 22 transported by the tablet receiver 23. The tablet chuck 24 squeezes the tablet 22 on the tablet receiver 23, and sends it to the next process apparatus or a molding pot.

Next, the apparatus constructed as above will be described. Upon turning on the power of this apparatus, the control unit 50 causes the horizontal drive motor 44 to rotate so that the mount 48 is moved to the position under the stocker 21A. Thereafter, the tablet receiver 23 is moved by the cylinder actuator 55 to the upper limit position and then moved downward. During this downward movement, the stopper 33A is opened and closed. As a result, the tablet receiver 23 receives only one tablet 22 and reaches the lower limit position. Thereafter, the tablet receiver 23 is moved to the position under the tablet chuck 24 which in turn picks up the tablet 22 on the tablet receiver 23 by squeezing it with the arms 24a, 24a. The above operations are repeated until all tablets 22 in the stocker 21A are completely used. The fact that all tablets 22 in the tablet stocker 21A are completely discharged is detected from the fact that although the tablet receiver 23 moves up to the upper limit position, the sensor 43 does not respond. In this case, the tablet receiver 23 moves to the position under the stocker 21B. The above operations are repeated for this stocker 21B.

Next, the operation of transporting a tablet 22 from the stocker 21A (21B) to the tablet chuck 24 will be described in detail with reference to FIGS. 3A to 3E.

Figure 3B:
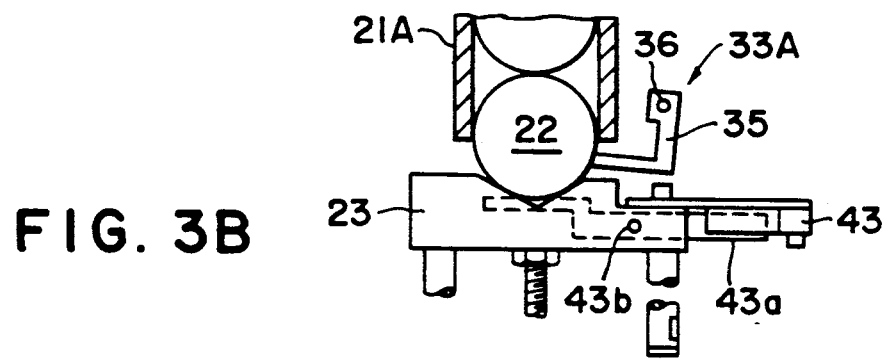
Figure 3C:
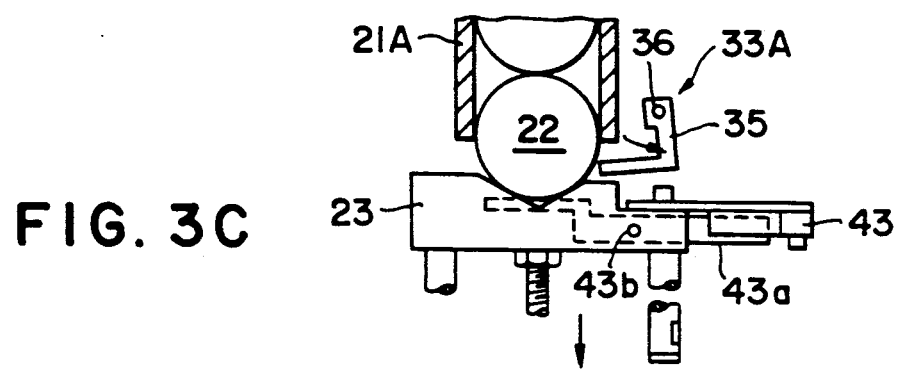
Figure 3D:
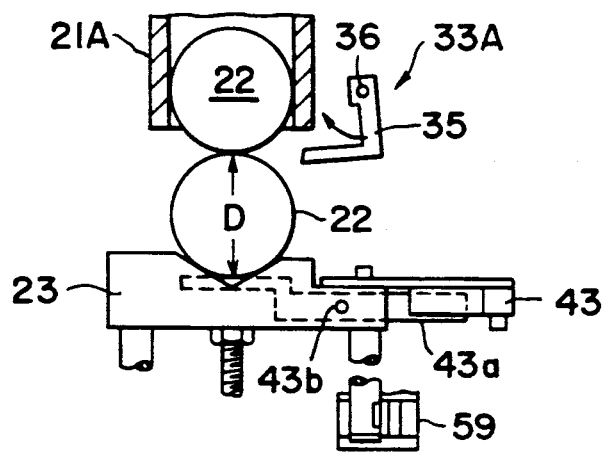

FIG. 3A illustrates the state immediately before the tablet receiver 23 returns to the stocker 21A after supplying a tablet to the tablet chuck 24. When the sensor 43 detects the absence of a tablet 22, the tablet receiver 23 is moved to the right as viewed in FIG. 3A in the horizontal direction to the second position under the stocker 21A, and then moved to the upper limit position (FIG. 3B).

In this state, the lower surface of the tablet 22 at the lowest position in the tablet stocker 21A, comes into contact with the upper surface of the groove 23a of the tablet receiver 23. By this, the detection piece 43a becomes horizontal and the sensor 43 operates. This is to say that the sensor 43 detects whether or not there is a tablet 22 in the groove 23a. A signal from the sensor 43 is sent to the control device 50. With this, the stopper member 35 is rotated in the counterclockwise direction around a pin 36, and is released, so that the lowest tablet 22 is no longer supported and so that all of the tablets 22 are allowed to fall (See FIG. 3C.)

Figure 3E:
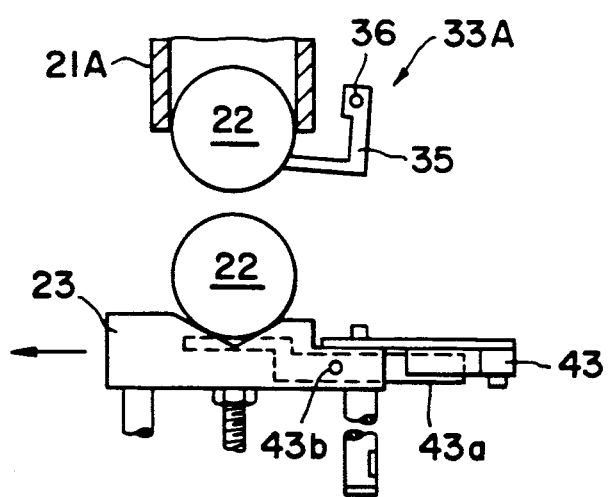
Figure 4:
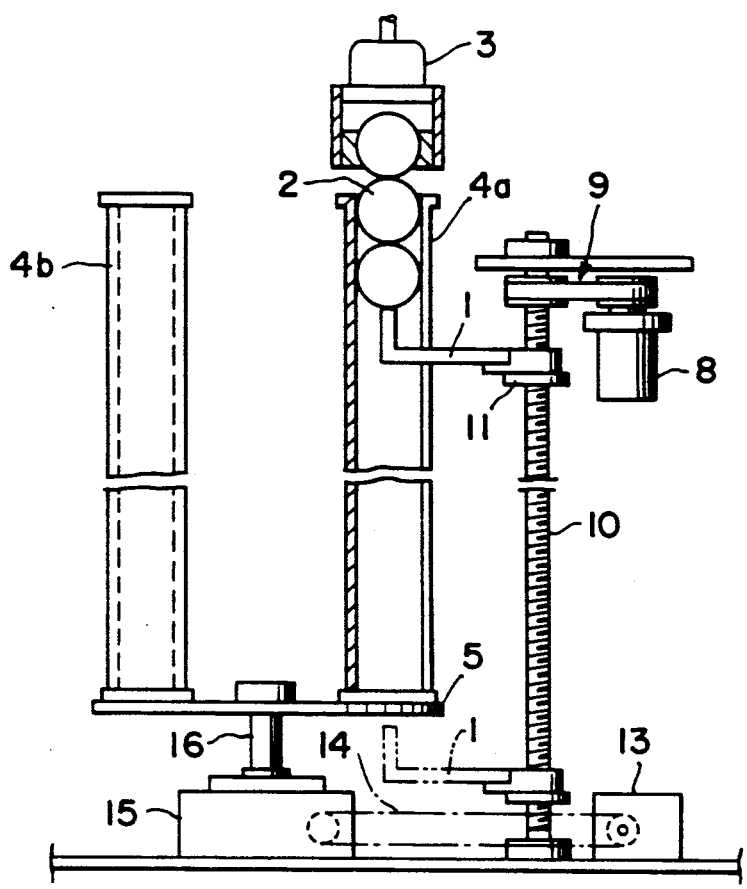
FIGS. 4 and 5 are a front view and a plan view showing a conventional apparatus.
Figure 5:
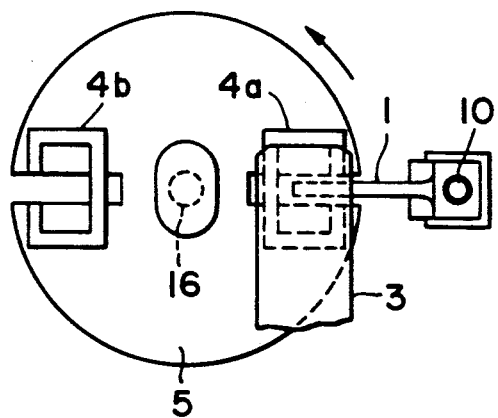

In this state, the tablet receiver 23 starts moving downward. Simultaneously with the downward movement of the tablet receiver 23, all tablets 22, 22, ... go down. When the tablet receiver 23 moves downward by the amount of the diameter D of the tablet 22 (FIG. 3D), the sensor 59 is actuated and the stopper member 35 rotates in the clockwise direction. The second lowest tablet 22 is therefore supported by the stopper member 35 so that the upper tablets 22 are prevented from moving downward. The tablet receiver 23 receiving one tablet 22 further moves downward to the lower limit position (FIG. 3E). Thereafter, the tablet receiver 23 moves to the left as viewed in the figure, and restores the state shown in FIG. 3A. The tablet 22 on the tablet receiver 23 is supplied to the tablet chuck 24. The above operations are repeated.

According to the embodiment of this invention, the following advantageous effects can be obtained. In the above-described embodiment, tablets 22 are discharged from the bottom of the tablet stockers 21A, 21B onto the tablet receiver 23, and the tablets are transported by the tablet receiver 23 to the tablet chuck 24. It is, therefore, not necessary to rotate the tablet stockers 21A, 21B, and to provide the mechanism and space for such rotation. In addition, with the above arrangement, it becomes possible to efficiently mount the tablet stockers 21A, 21B within a narrow area, thereby making the apparatus considerably small, simple in structure, and reduce its cost. Further, a tablet 22 received on the tablet receiver 23 is adapted to be correctly transported to the position under the chuck 24 so that the structure of the apparatus is less restrained by the position of the chuck 24, allowing the efficient use of space and making the overall apparatus compact. Furthermore, the tablet receiver 23 and the tablet chuck 24 are so constructed that the apparatus can be operated irrespective of the length (thickness) of the tablet 22. Consequently, even if the length (thickness) of the tablet 22 is changed, adjustment, replacement or the like of the components of the tablet receiver 23 and tablet chuck 24 is not required to thus allow an efficient use of the apparatus.

Since tablets are arranged to be moved downward by their own weight, a mechanism for moving tablets downward is not necessary. Since the tablets are discharged from the bottom of the stocker, the tablet receiver 23 can receive a tablet in a short time irrespective of the number of tablets within the stocker.

There are two tablet supplying methods. According to one method, tablets are supplied from the top opening of the stockers 21A, 21B during the operation of the apparatus. According to the other method, a stocker with tablets being housed therein beforehand is replaced with the stocker whose tablets were discharged completely.

If the height of the tablet stocker is made large, the number of tablets housed therein will increase. The space above the apparatus is generally free so that making the stocker higher does not pose any problem. Supplying tablets from the top opening of the vacant stocker as described before also poses no problem because of generally free upper space.

Figure 6:
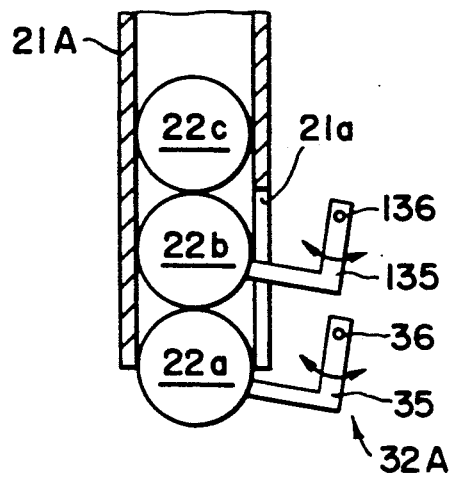
FIG. 6 is a cross section showing the main part of a different embodiment.

The tablet discharge mechanism provided for each stocker may have two stopper members, one example of which is shown in FIG. 6. In order to discharge a tablet 22a from the stocker 21A, first an upper stopper member 135 is set in a fall preventing state as shown in FIG. 6. In this state, the lower stopper member 35 is opened to place only one tablet 22a on the tablet receiver 23. Thereafter, the stopper member 35 restores a closed position as shown in FIG. 6. In this state, the stopper member 135 is opened. The tablets 22b and 22c are thereby moved downward by the amount of the diameter D, and supported by the stopper member 35. The above operations are repeated to discharge the tablets one by one. In FIG. 6, reference 21a represents a slit cut in the stocker 21A.

What is claimed is:

1. A resin tablet supplying apparatus, said resin tablet being formed generally of a pillar shape having a central longitudinal axis and being used in an encapsulating semiconductor device, said resin tablet supplying apparatus comprising:

a plurality of tablet stockers of a rectangular cylinder shape fixedly mounted at predetermined stationary positions for accommodating a plurality of resin tablets by stacking one upon another with the central longitudinal axis thereof extending horizontally;

a fixed plate upon which said tablet stockers are generally fixedly mounted vertically;

a tablet discharge opening formed in said fixed plate at a bottom end of each of said tablet stockers, and which communicates with the inside of said tablet stockers;

a tablet discharge means for discharging said tablets in each of said tablet stockers by dropping down said tablets one at a time from said tablet discharge opening, said tablet discharge means including a stopper member capable of switching between a shutting position where a plurality of tablets accommodated within said tablet stocker are kept from dropping down from said tablet discharge opening, and an opening position where a lowest tablet is allowed to be dropped down from said tablet discharge opening; and transportation means comprising a tablet receiver for receiving one tablet discharged by said tablet discharge means, a tablet chuck horizontally spaced from said tablet stockers, horizontal movement drive means for horizontally moving said tablet receiver between a position under each of said tablet stockers and a position under said tablet chuck, and an up/down movement drive means for moving said tablet receiver upward and downward between an upper limit position and a lower limit position at a position under each of said tablet stockers, whereby said transportation means receives said lowest tablet discharged one at a time by said tablet discharge means irrespective of whatever the axial length of said tablet may be, and transports a received tablet to said tablet chuck for conveying the received tablet to a next process, said tablet receiving and transporting being sequentially repeated with respect to the tablets in said plurality of tablet stockers.

2. A resin tablet supplying apparatus according to claim 1, wherein said tablet receiver has a tablet receiving groove having a V-shaped cross section.

3. A resin tablet supplying apparatus according to claim 1, wherein said tablet discharge means includes a switching drive means for switching the position of said stopper member to either said opening position of said shutting position, and wherein said apparatus further includes, first sensor means for detecting that the tablet receiver is at the upper limit position, the intermediate position and the lower limit position to output an upper limit position signal, an intermediate position signal, and a lower limit position signal, respectively, second sensors means for detecting that the tablet receiver is under each tablet stocker to output an under-stocker position signal, third sensor means for detecting a presence/absence of said tablet on said tablet receiver to output a tablet presence/absence signal, and control means for controlling said up/down movement drive means, horizontal movement drive means and switching drive means in accordance with the outputs from said respective sensor means.

4. A resin table supplying apparatus according to claim 3, wherein said control means controls said switching drive means to switch said stopper member to the opening position when the tablet receiver rises to the upper limit position to output the upper limit position signal, and to switch said stopper member to the shutting position when the tablet receiver receiving said tablet reaches an intermediate position by moving downward by the amount of the diameter of said tablet to output said intermediate position signal, to thereby prevent dropping down of the second lowest tablet and tablets higher than said second lowest tablets, and to make free only the lowest tablet so as to move said lowest tablet together with said tablet receiver to said lower limit position to output the lower limit position signal.

5. A resin tablet supplying apparatus according to claim 4, wherein said tablet receiver has a tablet receiving groove having a V-shaped cross section.

* * * * *